(12) United States Patent
Lee et al.

(10) Patent No.: US 6,222,212 B1
(45) Date of Patent: Apr. 24, 2001

(54) SEMICONDUCTOR DEVICE HAVING PROGRAMMABLE INTERCONNECT LAYERS

(75) Inventors: Ji-Min Lee, Palo Alto; Joseph F. Santandrea; Chuen-Der Lien, both of Los Altos Hills; Anita Hansen, Los Altos; Leonard Perham, Monte Sereno, all of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 08/621,432

(22) Filed: Mar. 25, 1996

Related U.S. Application Data

(63) Continuation-in-part of application No. 08/189,024, filed on Jan. 27, 1994, now Pat. No. 5,514,613.

(51) Int. Cl.[7] .................................................. H01L 27/10
(52) U.S. Cl. .......................... 257/207; 257/390; 257/529; 257/530; 257/777; 257/778
(58) Field of Search ................................. 257/529, 530, 257/777, 778, 390, 207

(56) References Cited

U.S. PATENT DOCUMENTS

| | | | |
|---|---|---|---|
| 3,795,974 | 3/1974 | Calhoun | 29/574 |
| 3,835,530 | 9/1974 | Kilby | 29/574 |
| 3,861,023 | 1/1975 | Bennett | 437/184 |
| 4,067,104 | 1/1978 | Tracy | 437/187 |
| 4,295,149 | 10/1981 | Balyoz et al. | 357/45 |
| 4,709,468 | 12/1987 | Wilson | 437/209 |
| 4,721,995 | 1/1988 | Tanizawa | 257/777 |
| 4,778,771 | 10/1988 | Hiki | 437/204 |
| 5,021,869 | 6/1991 | Kaw | 357/75 |
| 5,046,161 | 9/1991 | Takada | 257/778 |
| 5,189,507 | * 2/1993 | Carlomagno et al. | 257/777 |
| 5,192,716 | 3/1993 | Jacobs | 437/205 |
| 5,198,963 | * 3/1993 | Gupta et al. | 361/386 |
| 5,514,613 | * 5/1996 | Santandrea et al. | 437/51 |
| 5,523,628 | * 6/1996 | Williams et al. | 257/777 |
| 5,701,027 | * 12/1997 | Gordon et al. | 257/530 |
| 5,757,081 | * 5/1998 | Chang et al. | 257/778 |
| 5,825,092 | * 10/1998 | Delgado et al. | 257/778 |

* cited by examiner

*Primary Examiner*—William Mintel
(74) *Attorney, Agent, or Firm*—Bever Hoffman & Harms, LLP

(57) ABSTRACT

An integrated circuit structure is described which includes a base semiconductor structure and a programmable semiconductor structure which are fabricated separately and later joined to form the integrated circuit structure. The base semiconductor structure includes conventional semiconductor devices fabricated in accordance with a first set of design rules. The programmable semiconductor structure includes programmable elements fabricated in accordance with a second set of design rules which may be different than the first set of design rules. The programmable elements are used to control the configuration of the integrated circuit structure or to provide field programmable devices for use in the integrated circuit structure.

19 Claims, 12 Drawing Sheets

SEMICONDUCTOR DEVICE HAVING PROGRAMMABLE INTERCONNECT LAYERS

CROSS-REFERENCE TO RELATED APPLICATIONS

The present application is a continuation-in-part of Ser. No. 08/189,024, now, U S. Pat. No. 5,514,613, entitled "Parallel Manufacturing of Semiconductor Devices and the resulting Structure", filed Jan. 27, 1994 by Santandrea, et al.

BACKGROUND OF THE INVENTION

1. Field of the Invention

The present invention relates to semiconductor integrated circuits and in particular to integrated circuits which are programmably configurable or include field programmable elements. This invention also relates to methods for forming such integrated circuits.

2. Discussion of Prior Art

Integrated circuits are manufactured using a sequence of masking steps to form a plurality of transistors, diodes and other active and passive regions in a substrate (typically called a "wafer") of semiconductor material (typically silicon). Insulating layers and interconnect layers are formed over the surface of the wafer to interconnect the transistors, diodes and active and passive regions. As integrated circuits become more complex, with hundreds of thousands if not millions of transistors on each integrated circuit, the dimensions of the active regions formed in the substrate become smaller. As these dimensions become smaller, more devices can be fabricated on a given area of silicon, but the yield (i.e., the number of useful devices obtained at the end of the manufacturing process divided by the largest number of useful devices theoretically possible) drops for many reasons. These reasons include, for example, processing defects (e.g., particulates, film defects and masking defects), errors in mask alignment, and unwanted impurities in the wafer. With certain complex integrated circuits, as many as 20 to 30 masking steps may be employed and as many as 3 or 4 layers of interconnects may be required in order to produce an operative integrated circuit. Each of the masking steps must be carried out correctly and each of the interconnect layers must be formed as intended to obtain a working integrated circuit.

As the sizes of integrated circuits are increased, the yield drops, thereby increasing the costs of the resulting functional integrated circuits. Moreover, as the number of masking steps and interconnect layers increases, the time required to obtain a finished integrated circuit increases because each of the fabrication steps must be carried out sequentially.

Existing field programmable semiconductor devices, such as EPROM, EEPROM, flash memory, programmable logic devices (PLDs), field programmable gate arrays (FPGAs), erasable programmable logic devices (EPLDs), and fuse PROM are manufactured by conventional semiconductor fabrication processes, whereby the devices are fabricated by a plurality of sequential semiconductor processing steps. As previously described, the sequential nature of these processing steps reduces the process yield. Moreover, the field programmable elements used in the field programmable semiconductor devices complicate the overall process as compared to standard semiconductor processes used to make, for example, conventional logic elements such as logic gates. As a result, the process used to manufacture field programmable semiconductor devices is generally more complex, and therefore more costly, than the process used to manufacture conventional logic elements. Furthermore, the technology required to fabricate field programmable elements is often not compatible with the standard technology required to fabricate conventional logic elements. This incompatibility results, at least in part, from the high voltages and/or currents used to program the field programmable elements. As a result, trade-offs must be made in parameters such as design layout, process film thickness and junction depth, for example, in order to allow both the field programmable elements and the logic elements of the field programmable semiconductor devices to be fabricated on the same wafer. The result of these trade-offs is a field programmable semiconductor device which performs more poorly than a device fabricated using separate design rules.

Accordingly, it is desirable to have a method and structure which reduces the manufacturing time associated with the fabrication of an integrated circuit. It is also desirable to have a method and structure which reduces the complexity of the fabrication process required to make complex integrated circuits, particularly field programmable semiconductor devices. It is also desirable to have a method and structure which allows optimal design rules to be utilized in the manufacture of integrated circuits which include both conventional logic elements and field programmable elements.

SUMMARY OF THE INVENTION

In accordance with the present invention, the manufacture of integrated circuits is substantially simplified by using parallel processes to manufacture selected parts of the integrated circuits. The time required to manufacture a completed integrated circuit is significantly reduced because the selected parts are manufactured in parallel.

In one embodiment of the invention, an integrated circuit structure includes a base semiconductor structure and a programmable semiconductor structure. The base semiconductor structure contains active and passive semiconductor regions which are used in the finished integrated circuit structure. The programmable semiconductor structure is formed separately from the base semiconductor structure and is joined to the base semiconductor structure to form the integrated circuit structure. The programmable semiconductor structure contains at least one programmable element. In one embodiment, the programmable element is programmable to control the configuration of the integrated circuit structure. In another embodiment, the integrated circuit structure is a field programmable logic device, and the programmable element is a field programmable element.

Because the base semiconductor structure and the programmable semiconductor structure are fabricated separately, different design rules can be used in the fabrication of these structures, thereby optimizing the performance of both the base semiconductor structure and the programmable semiconductor structure.

In different embodiments, the programmable elements formed in the programmable semiconductor structure can include fuses, anti-fuses, EPROM cells, EEPROM cells, ferro-logic devices or a combination thereof.

In a particular embodiment of the invention, a plurality of electrically conductive first contact elements are connected to the active and passive regions of the base semiconductor structure. Additionally, a plurality of electrically conductive second contact elements are connected to the programmable elements. The first contact elements are exposed at a first surface of the base semiconductor structure and the second contact elements are exposed at a first surface of the programmable semiconductor structure. When the base semiconductor structure is joined to the programmable semiconductor structure, the first contact elements are electrically connected to the second contact elements, thereby forming the integrated circuit structure.

Several alternatives are provided for forming bonding pads on the integrated circuit structure. In one embodiment, the first surface of the base semiconductor structure includes a bonding pad region which extends laterally beyond the lateral perimeter of the first surface of the programmable semiconductor structure when the base semiconductor structure and the programmable semiconductor structure are joined. Bonding pads are formed over the bonding pad region and electrically conductive elements connect the bonding pads to the contact elements.

In another embodiment, the first surface of the programmable semiconductor structure includes a bonding pad region which extends laterally beyond the lateral perimeter of the first surface of the base semiconductor structure when the base semiconductor structure and the programmable semiconductor structure are joined. Bonding pads are formed over the bonding pad region and electrically conductive elements connect the bonding pads to the contact elements.

In yet another embodiment, bonding pads are formed on a second surface of the programmable semiconductor structure which is opposite the first surface of the programmable semiconductor structure. Electrically conductive via plugs, which are connected to the bonding pads, extend through the programmable semiconductor structure and contact the various contact elements.

In another embodiment, bonding pads are formed on a second surface of the base semiconductor structure which is opposite the first surface of the base semiconductor structure. Electrically conductive via plugs, which are connected to the bonding pads, extend through the base semiconductor structure and contact the various contact elements.

The present invention will be more fully understood in light of the following detailed description taken together with the drawings.

DETAILED DESCRIPTION

Figure 1:
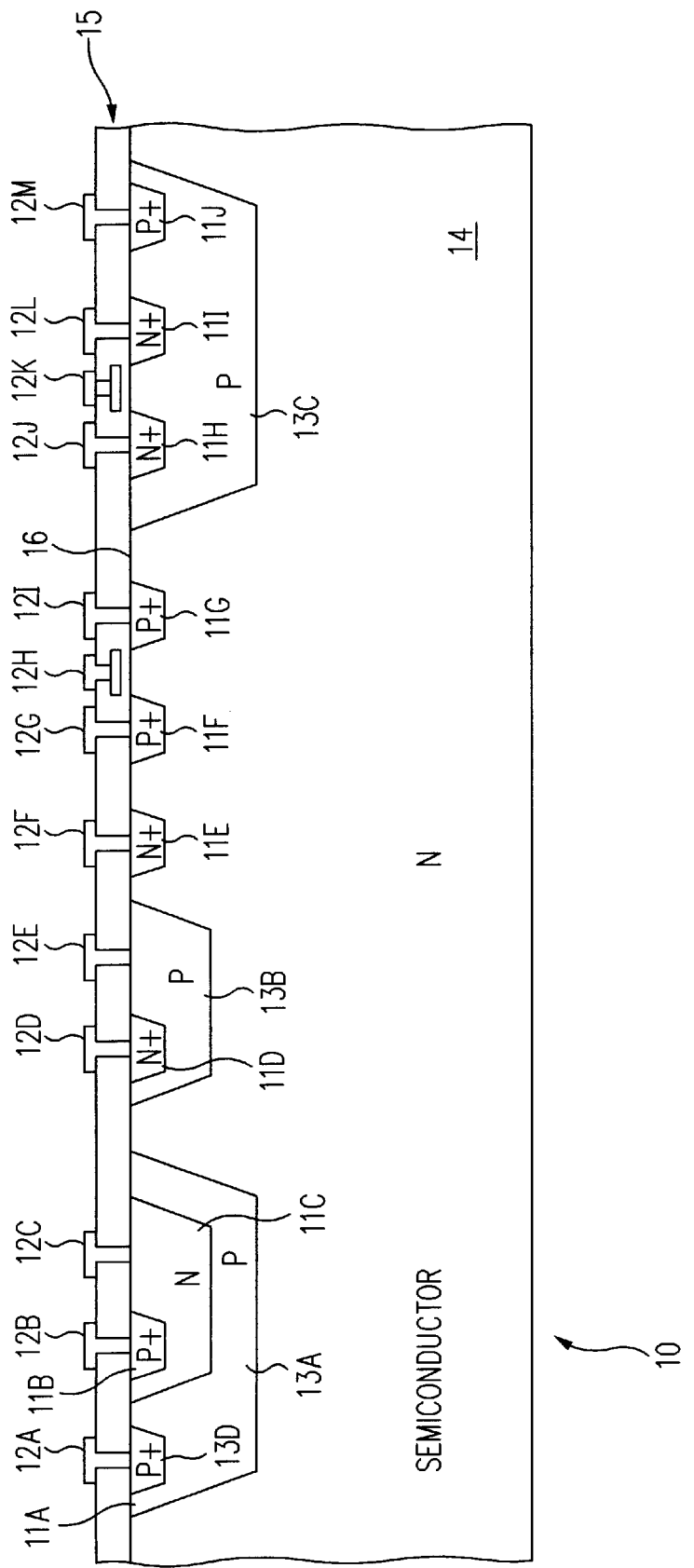
FIG. 1 is a cross section of a wafer containing active and passive semiconductor regions prior to connection of an interconnect layer.

As shown in FIG. 1, wafer 10 has a plurality of active and passive regions (such as regions 11A to 11J and 13A to 13C) formed in the semiconductor material 14 (typically but not necessarily silicon) using standard semiconductor processing techniques. Active regions 11A, 11B, and 11C might, for example, comprise the collector, emitter and base of a bipolar transistor while active regions 11F and 11G might, for example, comprise the source and drain of an MOS transistor. While normally bipolar and MOS transistors are not mixed on the same wafer, these regions are shown for the purpose of illustrating the broad applicability of this invention to cover both bipolar and MOS as well as biCMOS types of circuitry.

In addition, regions 11D and 11E are shown as comprising resistive paths within the wafer for inclusion in the circuitry to be formed from the wafer. Naturally an integrated circuit would contain hundreds of thousands if not millions of such active and passive regions formed to provide the desired transistor, diode, capacitor and resistor structure necessary to form the intended integrated circuit.

In normal processing, wafer 10 is fabricated by first taking a blank wafer which meets the semiconductor manufacturer's incoming wafer specifications and then forming a number of masking and insulation layers on the wafer to be used to form the desired active and passive regions of semiconductor material within the wafer. These active and passive regions are typically formed using ion implantation techniques and/or trench isolation techniques well known to the industry. Once all of the active and passive regions have been formed in the wafer, the wafer is ready for the formation of the interconnect structure on the top of the wafer.

Typically, the interconnect layers are then formed in sequence using standard processes known in the industry. For example, the surface of the wafer is either thermally oxidized or has deposited upon it a layer of insulation. This layer of insulation is then masked to form vias to the underlying active regions and an interconnect material is then formed on the surface of the composite structure above both the insulation and the portions of the surfaces of the active regions exposed by the vias. The interconnect layer is then masked and patterned to form the desired first interconnect structure.

A second layer of insulation is then formed over the first interconnect structure to electrically isolate the first interconnect structure from subsequent interconnect layers to be formed on the wafer. Following the formation of the second insulation layer, the second insulation layer is masked and vias are then formed through the second insulation layer to expose portions of the first interconnect structure and perhaps even portions of the underlying wafer if desired. A second interconnect layer is then formed on the wafer and this second interconnect layer is then masked so as to define the pattern of the second interconnect structure to be formed on the wafer. This sequential process continues until the desired number of interconnect layers have been formed on the wafer and contact pads for connecting the electrical circuitry within the wafer to the outside world have been formed on the top surface of the wafer. The wafer is then scribed and broken into separate integrated circuit dice that are then packaged in accordance with well known standard techniques in the industry.

In accordance with this invention, parallel processing is used to manufacture selected parts of finished integrated circuits. Upon completion of the parts, the parts are joined together to form the completed integrated circuit.

In accordance with one embodiment of this invention, semiconductor processing of wafer 10 (FIG. 1) is terminated after formation of first insulating layer 15 and conductive contacts 12A to 12M over the first surface 16 of semiconductor substrate 14. Conductive contacts 12A to 12M provide contact to selected active and passive semiconductor regions (11A to 11J and 13A and 13C) of wafer 10. The interconnect layers for wafer 10 are formed as part of a separate interconnect structure as described below. In accordance with another embodiment of this invention, additional (but not all) interconnect layers of an integrated device are formed on wafer 10 using process steps well known in the manufacture of semiconductor devices, while the rest of the interconnect layers are formed as part of the separate interconnect structure.

The interconnect structure 30 can be separately fabricated before, during (i.e., in parallel) or after the fabrication of the wafer 10. The interconnect structure 30 can be held in inventory until the wafer 10 is completed. The interconnect structure 30 is connected to the wafer 10 using standard bonding techniques available in the industry. Alternatively, a combination of standard bonding techniques and alignment techniques together with passivating glass or other insulative material can be used to form a tight bond between the interconnect structure and the underlying wafer.

Figure 2A:
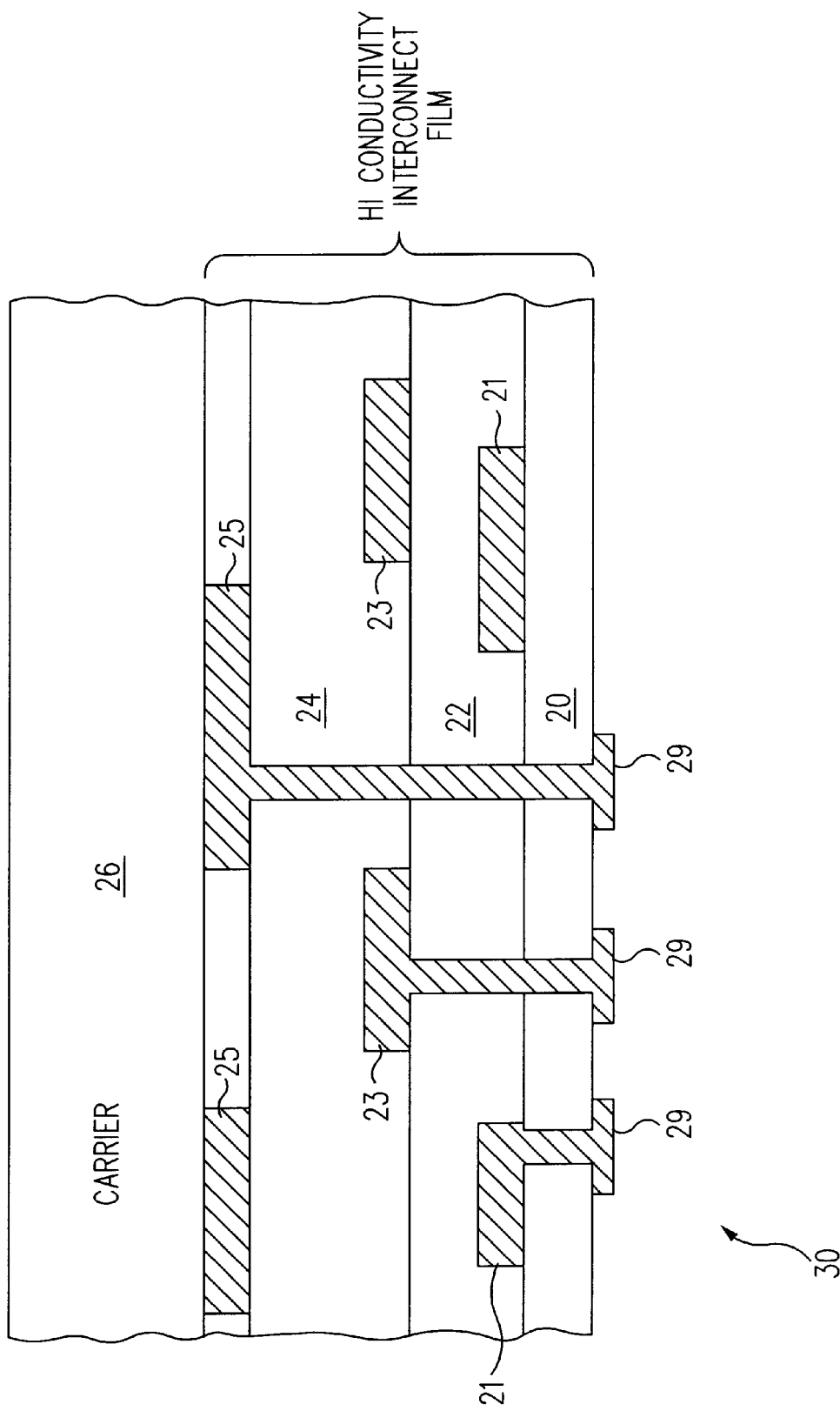
FIG. 2A is a cross section of a portion of an interconnect structure in enlarged view.

FIG. 2A illustrates a portion of an interconnect structure in enlarged view of a type suitable for use with this invention. As shown in FIG. 2A a first interconnect layer 21 is formed on top of insulation 20. Insulation 20 can be any of several well known insulating materials including glass such as silicon dioxide. The first interconnect layer 21 typically will be fabricated of an electrically conductive material such as any metal or alloy including aluminum, copper, titanium tungsten, silicides, or even polycrystalline silicon selectively doped. Following the fabrication (including patterning) of the first interconnect layer 21 (portions of which may extend completely through vias in insulation 20), a second layer of insulation 22, typically silicon dioxide or some other acceptable glass such as a mixture of silicon and germanium oxides, is formed over the first interconnect layer 21. This glass is masked using standard photolithographic techniques and vias are formed through this glass to the first interconnect layer. A second interconnect layer 23 is then formed on glass layer 22. Second interconnect layer 23 is then patterned to form the desired interconnection pattern. Again, second interconnect layer 23 can be any suitable material such as aluminum, copper, or a high-temperature-resistive material such as a metal silicide or a polycrystalline silicon doped layer. Following the formation of patterned interconnect layer 23 another insulating layer 24 of a selected material which, for example, might be an oxide of silicon or silicon nitride or even a polyimide or ceramic material, is formed on layer 23. Yet another (a third) interconnect layer 25 can be formed and patterned on insulating layer 24 to form the desired interconnect pattern. A carrier 26 is then formed on the resulting interconnect structure containing three patterned interconnect layers.

As shown in FIG. 2A the interconnect structure 30 thus contains all of the components that would normally be expected in an interconnect structure having three interconnect layers, but is fabricated separately from the underlying wafer. Typically in the fabrication of the interconnect structure 30 shown in FIG. 2A, the structure can be initially formed on an underlying carrier (not shown in FIG. 2A) of selected material, even silicon, which later can be etched away or otherwise removed by any of several well-known processes such as, for example, dry plasma etch or chemical-mechanical polish thereby to leave the interconnect structure 30 in a form as shown suitable for use with wafer 10. The initial carrier which is a sacrificial substrate can also be alumina $Al_2O_3$ or any other suitable ceramic material. The carrier is etched away or otherwise removed to expose the bottom surface of the interconnect structure 30 prior to the use of the interconnect structure 30 in its intended role in a finished integrated circuit. In accordance with this invention, the top carrier 26 shown in FIG. 2A can be removed either prior to or subsequent to the interconnect structure 30 being joined to the wafer 10.

Also, in accordance with this invention, the interconnect structure 30 can be fabricated by forming the carrier 26 first and then providing the layers of interconnect patterns in reverse order to the order in which they would be formed if sequentially fabricated on wafer 10 as in the prior art. Alternatively, the interconnect structure 30 can be formed bottom up with the layers of interconnect patterns being formed first on a sacrificial carrier (not shown) and the carrier 26 being formed in the final step.

Figure 2B:
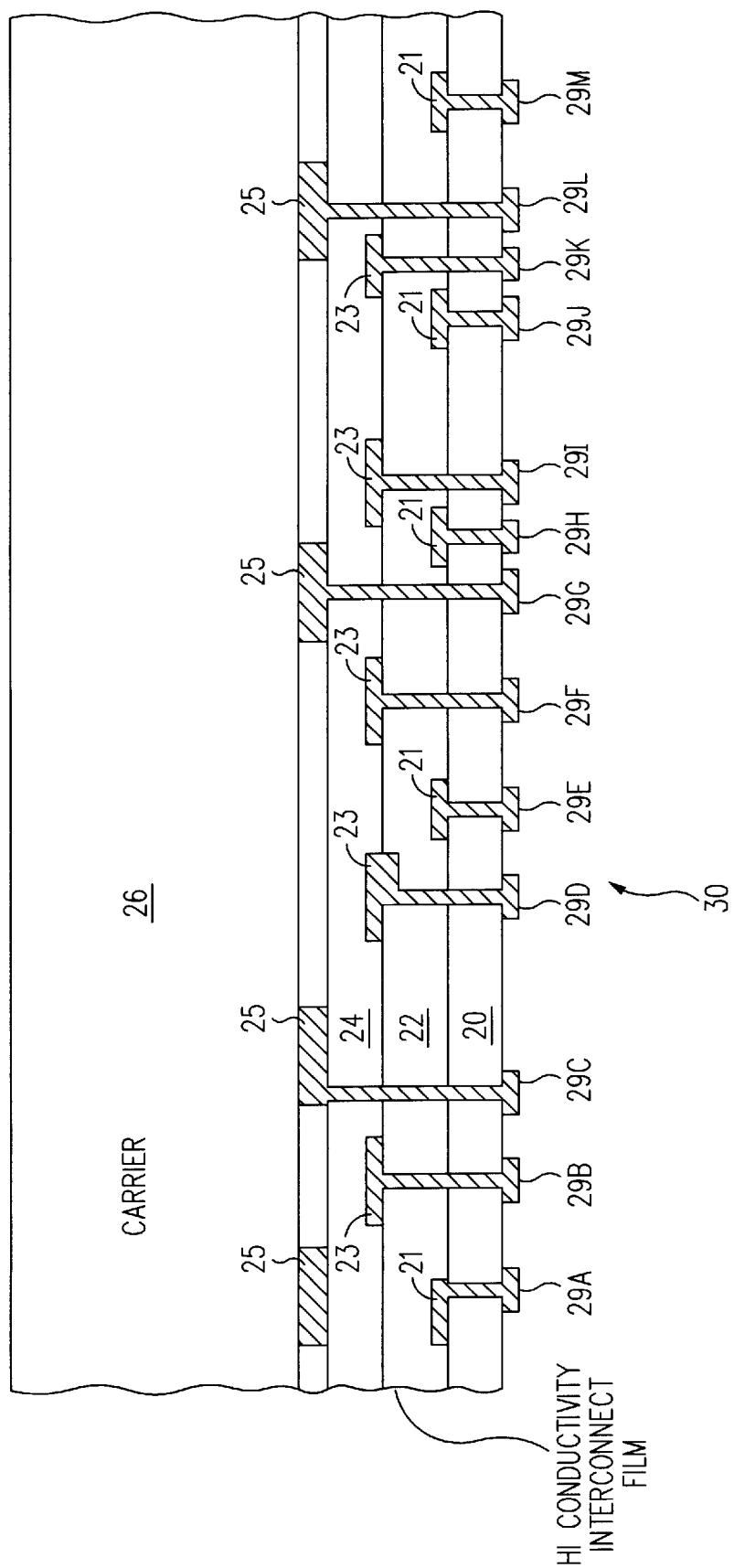
FIG. 2B shows a larger portion of the interconnect structure of FIG. 2A.

FIG. 2B shows a larger portion of the interconnect structure of FIG. 2A.

Figure 3:
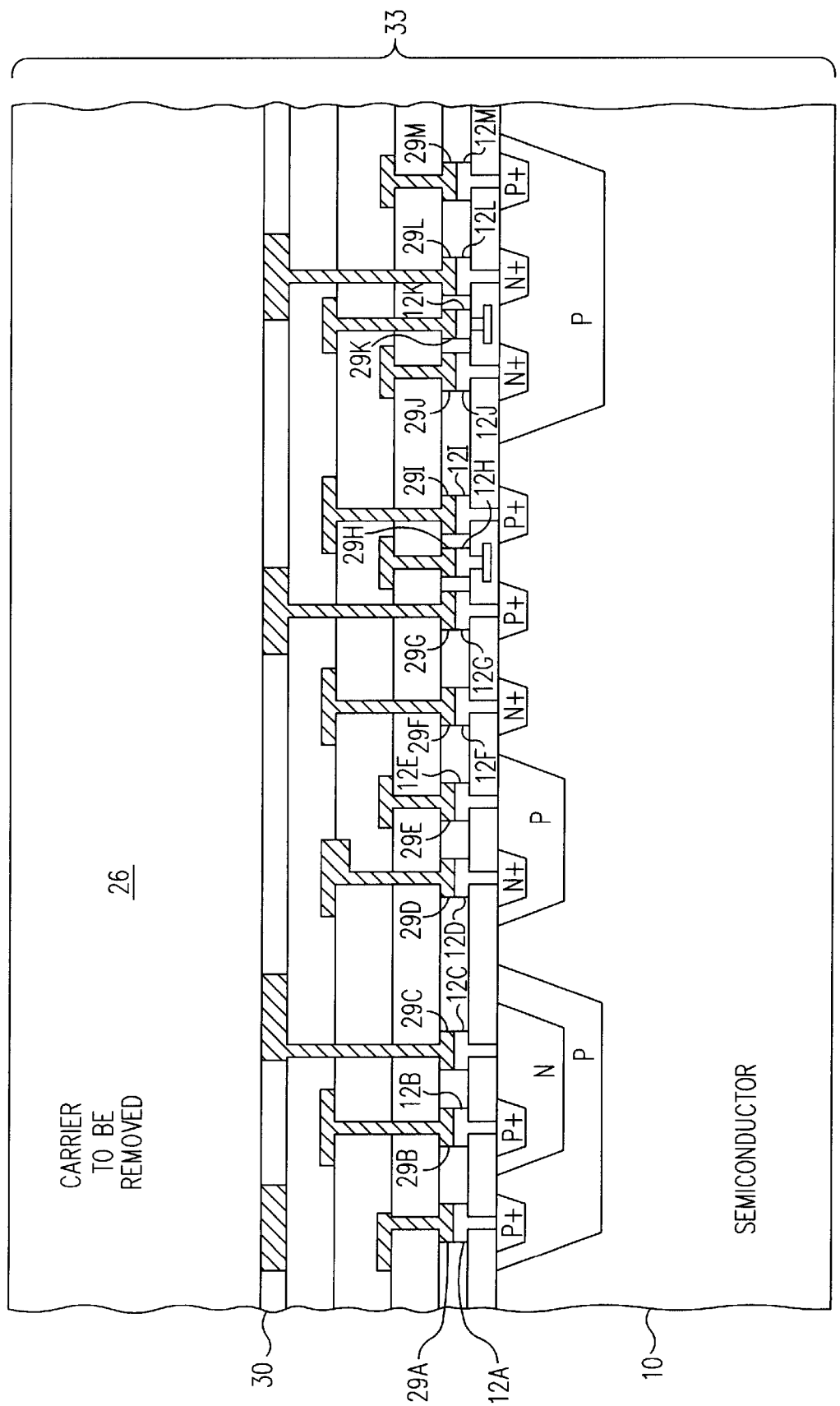
FIG. 3 is a cross section of the wafer of FIG. 1 combined with the interconnect structure of FIG. 2B to form a finished unpackaged integrated circuit.

FIG. 3 illustrates wafer 10 of FIG. 1 combined with the interconnect structure 30 of FIG. 2B to form the finished unpackaged integrated circuit. For simplicity many numbers on the structures of FIGS. 1 and 2B are omitted in FIG. 3. The interconnect structure 30 has been joined to wafer 10 by placing contacts 29A to 29M of the interconnect structure 30 directly adjacent and in electrical contact with conductive contacts 12A to 12M. The composite structure 33 is then heated to a selected temperature for a selected time to form a desired unitary bond between the wafer 10 and the interconnect structure 30. As a result, the active and passive semiconductor regions of wafer 10 are connected as desired by the interconnect structure 30. In one embodiment, when the interconnect structure 30 contains aluminum the heat treatment must be less than the temperature at which the aluminum will melt (i.e. less than approximately 550° C). When, however, the interconnect structure 30 is formed using interconnect materials capable of resisting high temperatures, then the heat treatment for joining interconnect structure 30 to wafer 10 can take place at higher temperatures.

In one embodiment of this invention, the interconnect structure 30 and the semiconductor wafer 10 are in intimate contact with each other so that the interconnect structure and the semiconductor wafer are mechanically bonded. In another embodiment of this invention, a layer of selected gas, typically inert, is present between the adjacent surfaces of the interconnect structure 30 and the semiconductor wafer except at the conductive contacts 29A to 29M to the active and passive semiconductor regions 11A to 11J and 13A to 13C within the wafer 10. In one embodiment of this invention, the thickness of the layer of gas is greater than or equal to 2000 angstroms. One advantage of a layer of gas is that capacitance is reduced due to isolation provided by the gas layer so that the RC effects of the interconnect structure 30 have minimal impact on the components in the semiconductor material 10.

In one embodiment in accordance with this invention, the interconnect structure 30 is joined to the wafer 10 using solder balls (typically, although not necessarily of 1.5 micron size) formed using conventional processes. In another embodiment, the interconnect structure 30 is joined to the wafer 10 using an electrically conductive epoxy.

One of the advantages of the invention is that interconnect structure 30 can be fabricated in accordance with design rules which are more tolerant and easier to implement than the design rules used to fabricate the underlying wafer 10. This results in a decrease in the cost of manufacture of the resulting integrated circuit and an increase in the yield. Interestingly, the use of a different set of design rules for the manufacture of the integrated circuit interconnect structure 30 as opposed to the wafer 10 does not deleteriously affect the performance of the wafer 10 because important critical parameters such as the RC loading sensed by the drive transistors on the wafer can be lowered. For example, RC loading can be reduced by increasing the thickness of the insulation and decreasing the resistance of the interconnect material. Thus the RC loading seen by the drive transistors of the wafer 10 can be made equal to or less than the RC loading present in current integrated circuits while at the same time using less stringent design rules for fabricating the interconnect structure than those associated with the integrated circuit wafer 10. The resistances of interconnects can be decreased by choosing the material, width and thickness of the conducting layers of the interconnect structure independently of the wafer's process parameters.

Among the advantages of this invention are not only the improved yield and the possibility of using less stringent design rules to make the interconnect structure but in addition the flexibility of the materials that can be used for the interconnect structure. In accordance with this invention, process limitations in manufacturing one group of layers do not affect the processes used to manufacture another group of layers or the base wafer, so that limitations on the kinds of materials and process parameters (such as silicon contamination) do not have the significant impact that is common for conventional processes. This leads to lower costs and provides higher performance in the finished integrated circuit. For example, the use of less stringent design rules and alternative materials to fabricate the interconnect structure 30 allow the use of alternative lower cost processes in the fabrication of the interconnect structure than were heretofore available. For example, plating can be used to form interconnect layers, whereas in normal integrated circuit production plating is not commonly thought to be suitable for such use. Therefore, materials used in forming the conducting layer of an interconnect structure are not limited by conventional metallization schemes of very large scale integrated circuit (VLSI) processing. In one embodiment, the conducting layers of the interconnect structure are formed of metals and alloys such as for example, copper, gold and tungsten.

Another advantage of this invention is that there are no substantial process limitations on the size of an integrated device because several groups of layers can be built independently in parallel and the groups can be subsequently joined together to build the final integrated device. Therefore the device size can be very large and include many more interconnect layers than heretofore thought possible without having an adverse impact on the yield. Furthermore, because a number of sub-groups of layers can be built in parallel, the manufacturing cycle time is significantly improved.

In accordance with this invention, a wafer, containing for example gate arrays, can be manufactured and stored in inventory independent of receipt of customer orders and manufacture of custom layers. Custom layers can be manufactured after receipt of a customer order and joined to the wafer to provide the final product.

One of the difficulties associated with manufacturing integrated circuits is testing each integrated circuit at various stages in production to determine whether or not the intermediate structure has defects which should either be corrected or which result in scrapping of the product at that point. Naturally, it is important to detect defects as soon as possible to avoid adding value to what will ultimately be a defective product. Failure to detect such defects at the earliest possible stage of production increases the cost of the finished product.

In accordance with this invention, the wafer and the interconnect structure will each be individually optically inspected by optical inspection equipment of well-known design and the resulting images will be compared to a database in a computer by the inspection equipment. Should the images not be consistent with the database, then the computer will automatically indicate a problem and the problem can then be either corrected or the product discarded. Such optical inspection can be carried out at every stage, at every alternate stage or at some desirable intermediate stage in production of the wafer and in production of the interconnect structure. Although optical inspection is described above, any inspection technique, such as for example, electrical inspection of the wafer and/or the interconnect structure can be used in accordance with this invention.

In accordance with this invention, the joining of the interconnect structure to the wafer is done prior to separation of the dice from the wafer. Alternatively, the wafer can be first separated into dice and an interconnect substructure associated with each die can then be joined to that die on a die-by-die basis. The interconnect substructure can be either formed initially as a single interconnect structure that is separated into a plurality of interconnect substructures or alternatively each interconnect substructure can be formed independently and separately of other interconnect substructures.

In another embodiment of the invention, various dice are joined to a single interconnect structure. The dice can be unfinished components of a commercial integrated circuit device or alternatively, the dice can themselves be finished commercially available dice. In one embodiment in accordance with this invention, a single microprocessor with on-board cache memory is formed by joining a microprocessor die and a random access memory die to a single interconnect structure.

In another embodiment of this invention, wafer scale integration is possible wherein the interconnect structure can be programmed to reflect the test results of the wafer to exclude from the integrated circuit those portions of the wafer which have been determined to be defective. This invention makes possible wafer scale integration on an economic and practical basis.

FIGS. 4–9B illustrate semiconductor structures in accordance with alternative embodiments of the present invention. These semiconductor structures have the same advantages previously described in connection with the interconnect structure 30 and the semiconductor wafer 10.

Figure 4:
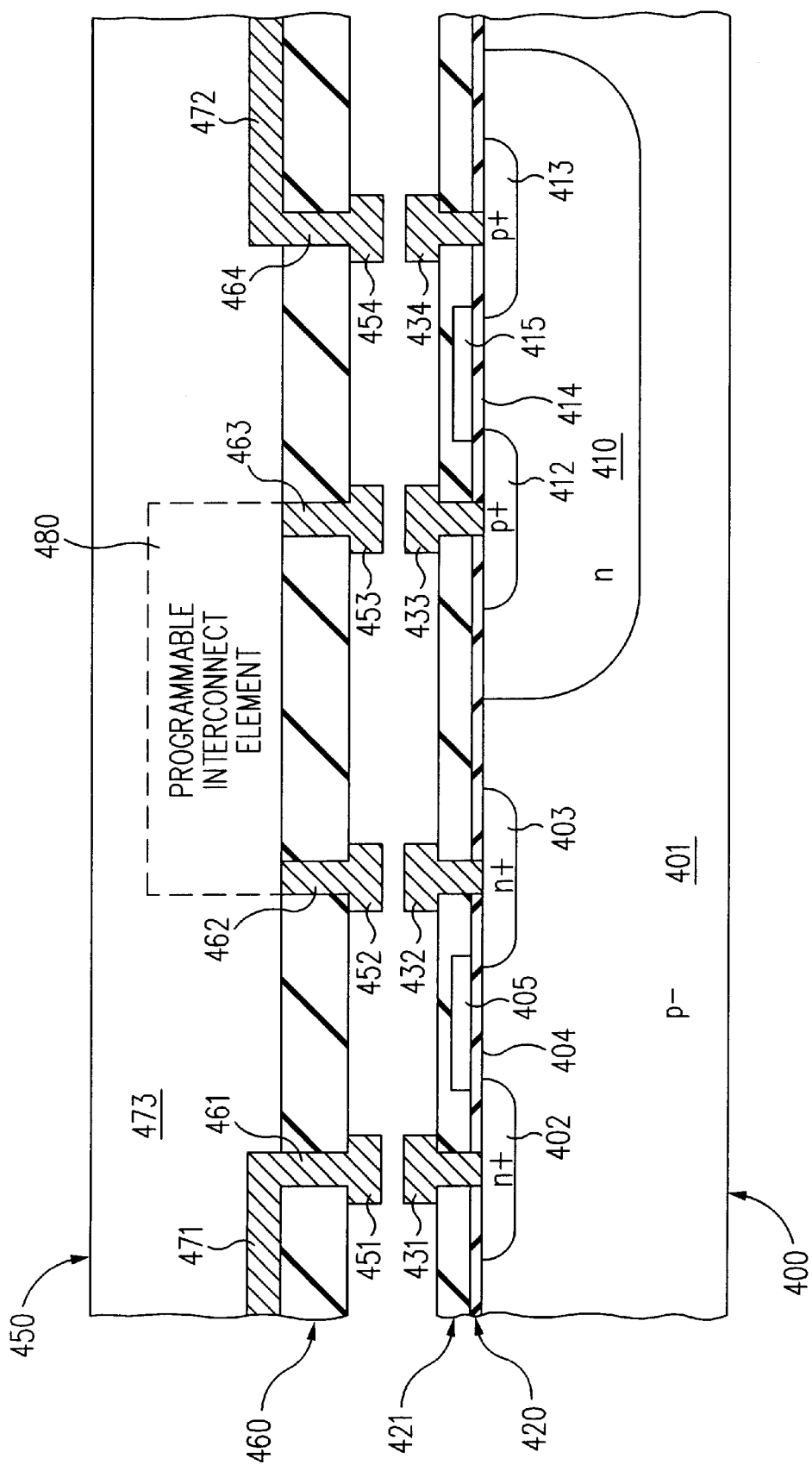
FIG. 4 is a cross section illustrating a programmable semiconductor structure and a base semiconductor structure in accordance with one embodiment of the invention.

FIG. 4 is a cross sectional diagram illustrating a programmable semiconductor structure 450 and a base semiconductor structure 400 in accordance with another embodiment of the invention. Programmable semiconductor structure 450 includes electrically conductive protruding connector elements 451–454, insulating layer 460, electrically conductive via plugs 461–464, electrically conductive interconnect portions 471–472, programmable interconnect element 480 and substrate 473. Although programmable semiconductor structure 450 is shown with a single interconnect layer, in other embodiments, multiple interconnect layers can be used.

Programmable semiconductor structure 450 is coupled to base semiconductor structure 400 in a manner similar to that previously described in connection with interconnect structure 30 and wafer 10. Base semiconductor structure 400 includes a p-type monocrystalline silicon substrate 401. An n-channel MOS transistor is formed by n-type drain/source regions 402–403, channel region 404, gate electrode 405, gate oxide layer 420, insulating layer 421 and electrically conductive elements 431–432. A p-channel MOS transistor is formed by n-well 410, p-type drain/source regions 412–413, channel region 414, gate electrode 415, gate oxide layer 420, insulating layer 421 and electrically conductive elements 433–434. The n-channel and p-channel transistors together can comprise part of a CMOS circuit. Although only two transistors are illustrated, it is understood that base semiconductor structure 400 can include many more active and passive semiconductor devices. Moreover, the listed conductivity types are exemplary and not to be construed as limiting the scope of the present invention. The conductivity types could be reversed with similar results. In addition, base semiconductor structure 400 can include multiple interconnect layers formed over insulating layer 421 in other embodiments.

In a first application of base semiconductor structure 400, it may be desirable to have drain/source region 403 coupled to drain/source region 412, while in a second application, it may be desirable to have drain/source region 403 isolated from drain/source region 412. When base semiconductor structure 400 is connected to programmable semiconductor structure 450, drain/source region 403 is coupled to programmable interconnect element 480 by the electrical path formed by conductive elements 432, 452 and 462. Similarly, drain/source region 412 is coupled to programmable interconnect element 480 by the electrically conductive path formed by elements 433, 453 and 463. Programmable interconnect element 480 operates as a switch which either establishes or prevents an electrical connection between elements 462 and 463 (thereby connecting or disconnecting drain/source regions 403 and 412).

The configuration of programmable interconnect element 480 between drain/source 403 and drain/source 412 is illustrative, not limiting. That is, programmable interconnect element 480 can be used to connect (or not connect) a wide variety of circuit elements on base semiconductor structure 400. Various embodiments of programmable interconnect element 480 are described in more detail in connection with FIGS. 5A, 5B and 6.

Figure 5A:
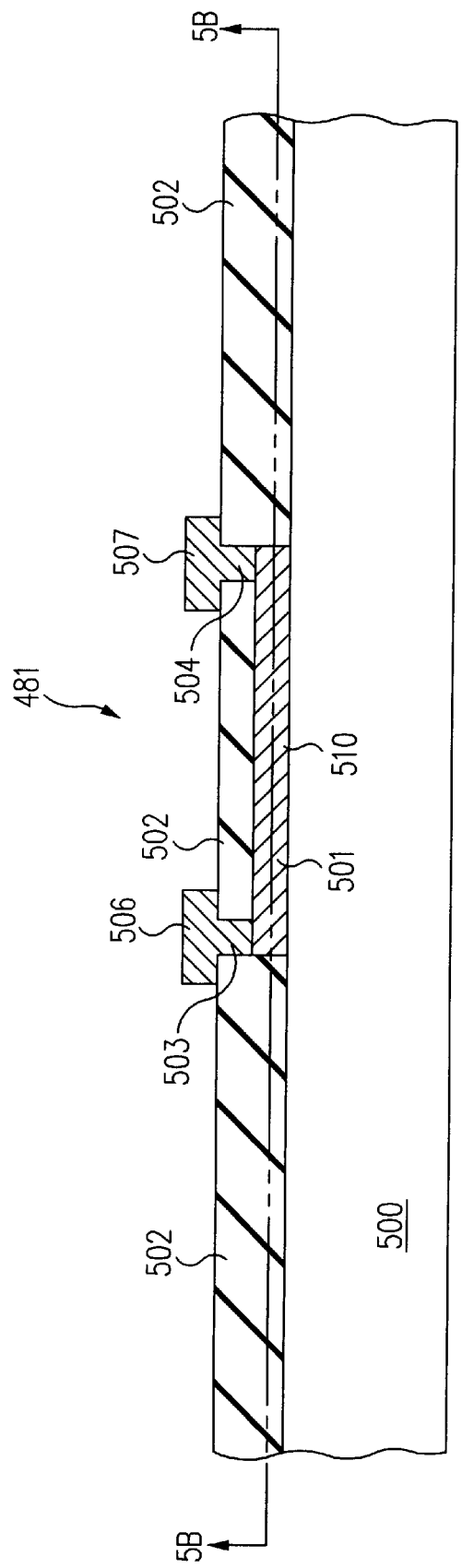
FIG. 5A is a cross section of a programmable interconnect element in accordance with one embodiment of the invention.
Figure 5B:
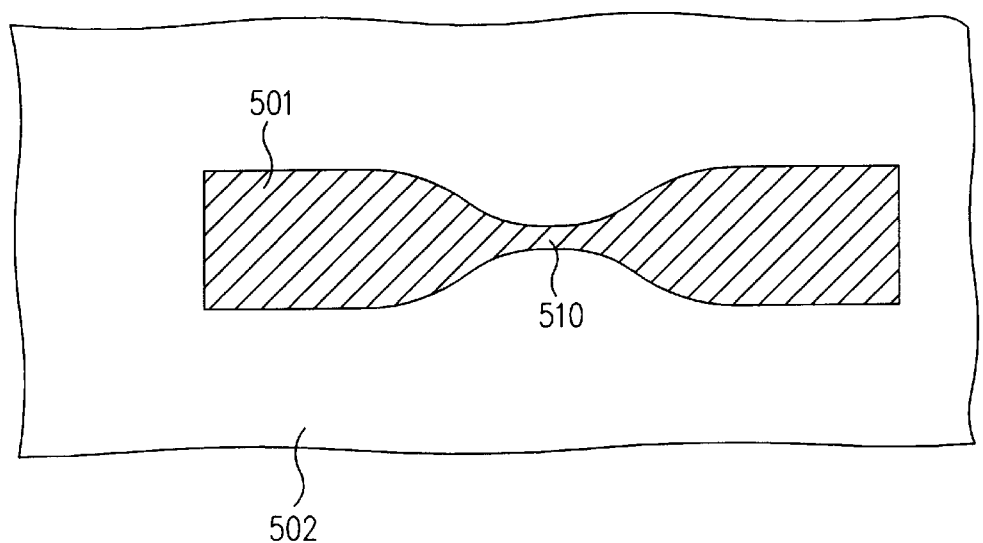
FIG. 5B is a cross section of the programmable interconnect element of FIG. 5A along plane 5B—5B.

FIG. 5A is a cross sectional diagram of a programmable interconnect element 481 in accordance with one embodiment of the invention. Programmable interconnect element 481 is a fuse which includes a substrate 500, a layer 501 of conductively doped polycrystalline silicon, an insulating layer 502, electrically conductive via plugs 503–504, and electrically conductive connector elements 506–507. FIG. 5B is a cross sectional diagram of programmable interconnect element 481 along plane 5B—5B of FIG. 5A. Polysilicon layer 501 has a thin portion 510 which can be blown (i.e., melted such that polysilicon layer 501 is discontinuous) by applying a voltage across connector elements 506 and 507 which is higher than the voltages encountered across connector elements 506 and 507 during normal operating conditions. By selectively blowing (or not blowing) thin portion 510, interconnect element 481 can be programmed to provide the desired configuration. In a particular embodiment, programmable interconnect element 481 is programmed before being connected to base semiconductor structure 400. In another embodiment, programmable interconnect element 481 is programmed after being connected to base semiconductor structure 400.

Programmable semiconductor structure 450 is connected to base semiconductor structure 400 such that connector elements 506 and 507 of programmable interconnect element 481 contact conductive elements 432 and 433 of base semiconductor structure 400.

Programmable interconnect element 481 is a passive element. After element 481 has been programmed and connected to a wafer structure, element 481 is not reprogrammed during normal operation of the resulting circuit. Programmable interconnect element 481 provides flexibility in selecting the configuration of programmable semiconductor structure 450. Several programmable semiconductor structures 450 can each be programmed to achieve a different configuration, thereby allowing programmable semiconductor structure 450 to be used to interconnect a given base semiconductor structure into any one of many different configurations.

Figure 6:
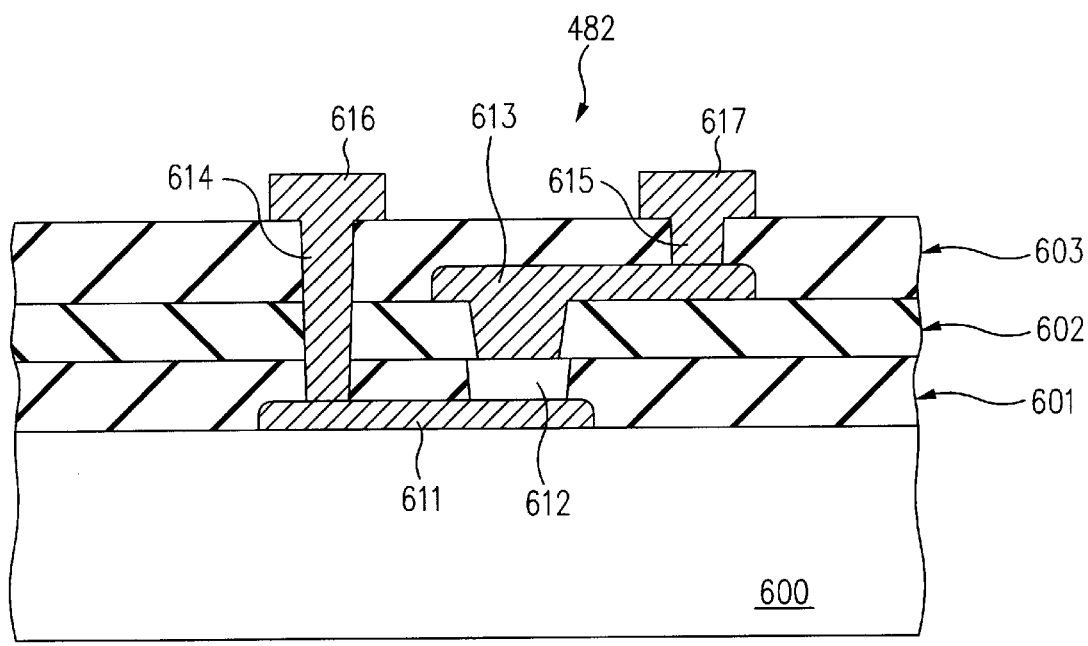
FIG. 6 is a cross section of a programmable interconnect element in accordance with another embodiment of the invention.

FIG. 6 is a cross sectional diagram of a programmable interconnect element 482 in accordance with another embodiment of the present invention. Programmable interconnect element 482 is an anti-fuse which includes substrate 600, insulating layers 601–603, first electrically conductive portion 611, thin intrinsic polysilicon layer 612, second electrically conductive portion 613, electrically conductive via plugs 614 and 615, and electrically conductive contact elements 616 and 617.

Interconnect structure 482 is normally non-conductive between contact elements 616–617 because of the non-conductive nature of intrinsic polysilicon layer 612. However, by applying a large voltage across contact elements 616 and 617, polysilicon layer 612 melts and allows electrical contact between first and second electrically conductive portions 611 and 613. Programmable interconnect element 482 is a passive interconnect structure which operates in a manner similar to interconnect structure 481 (FIGS. 5A–5B). Programmable interconnect element 480 can be made from other passive elements. For example, interconnect element 480 can be a bipolar fuse.

Programmable interconnect element 480 can also be made using an active element such as an EEPROM, EPROM, flash EPROM or PROM cell. To accomplish this, the active elements are fabricated on substrate 473 of programmable semiconductor structure 450 in accordance with conventional processing techniques. The active elements are programmed in accordance with conventional programming methods either before or after programmable semiconductor structure 450 is connected to base semiconductor structure 400.

Figure 7:
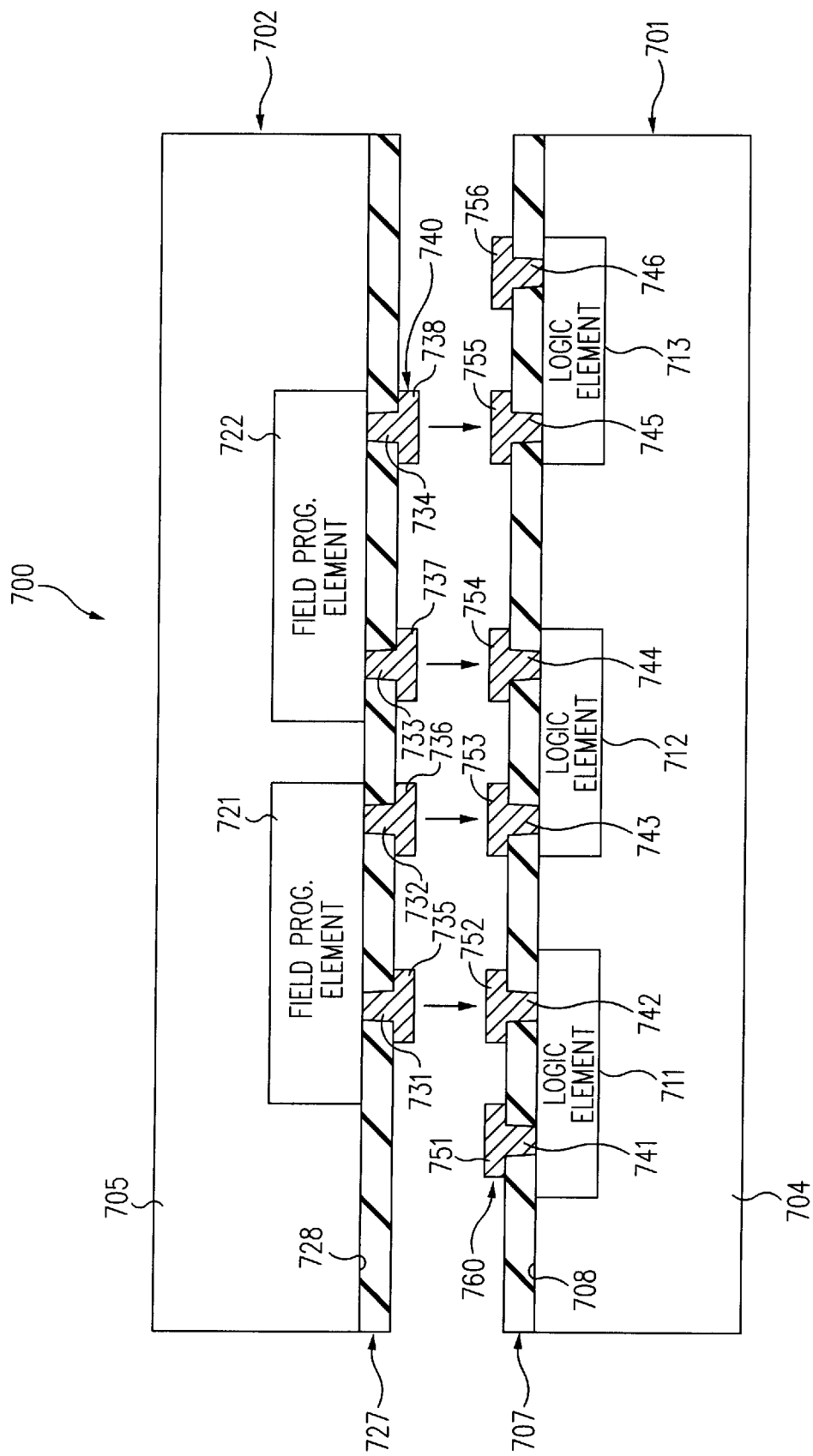
FIG. 7 is a cross sectional schematic diagram of a field programmable semiconductor device in accordance with another embodiment of the invention.

FIG. 7 is a cross sectional schematic diagram of a field programmable semiconductor device 700 in accordance with another embodiment of the invention. Field programmable semiconductor device 700 includes a base semiconductor structure 701 and a field programmable semiconductor structure 702. Logic elements 711, 712 and 713, which are typically found in conventional field programmable semiconductor devices, are fabricated in base semiconductor structure 701. Logic elements 711–713 can include, but are not limited to, logic gates, decoders, flip flops and/or a central processing unit (CPU). Logic elements 711–713 are fabricated in a monocrystalline semiconductor substrate 704 in accordance with a first set of design rules intended to maximize the performance of logic elements 711–713. An insulating layer 707, such as silicon oxide, is formed over surface 708 of semiconductor substrate 704. Electrically conductive via plugs 741–746 extend through insulating layer 704 to provide connections to logic elements 711–713. Via plugs 741–746 are connected to a first interconnect layer 760 which includes electrically conductive connector elements 751–756. In other embodiments, multiple interconnect layers and insulating layers of a type well-known in the semiconductor arts are included on base semiconductor structure 701 over surface 708.

Field programmable logic elements 721–722 are fabricated in or on monocrystalline semiconductor substrate 705 as part of programmable semiconductor layer 702. Semiconductor substrate 705 can be, for example, an epitaxial silicon layer on a silicon substrate, or a monocrystalline silicon substrate. Field programmable elements 721–722 are conventional field programmable devices which include, for example, EEPROM cells, EPROM cells, polysilicon fuses, antifuses and flash memory. Field programmable elements 721–722 are fabricated in a semiconductor substrate 705 in accordance with a second set of design rules which are different from the first set of design rules used to fabricate base semiconductor structure 701. The second set of design rules maximizes the performance of field programmable elements 721–722. An insulating layer 727, such as silicon oxide, is formed over surface 728 of semiconductor substrate 705. Electrically conductive via plugs 731–734 extend through insulating layer 727 to provide connections to field programmable devices 721 and 722. Via plugs 731–734 are connected to an electrically conductive interconnect layer 740 which includes electrically conductive connector elements 735–738. In other embodiments, programmable semiconductor structure 702 can include multiple interconnect layers and insulating layers fabricated over surface 728 in accordance with techniques which are well-known in the semiconductor arts.

Connector elements 752–755 of base semiconductor structure 701 are connected to corresponding connector elements 735–738 of programmable semiconductor structure 702, thereby joining the base semiconductor structure 701 and the programmable semiconductor structure 702. Connector elements 735–738, 752–755 can be connected using the methods previously described in connection with interconnect structure 30 and semiconductor wafer 10 (FIG. 3) Logic elements 711–713 and field programmable elements 721–722 are connected such that the circuit formed by these connected elements is identical to circuitry which, in prior art field programmable devices, would otherwise be laid out on a single surface of a die in a single wafer.

By fabricating logic elements 711–713 on one substrate 704, and field programmable elements 721–722 on another substrate 705, several advantages are realized. First, the performance of field programmable semiconductor device 700 is improved because the design rules for logic elements 711–713 and field programmable elements 721–722 are optimized. Moreover, the cycle time to manufacture field programmable semiconductor device 700 is shortened because the parallel manufacturing process allows the semiconductor structures 701 and 702 to be fabricated simultaneously, thereby reducing the processing time required to complete device 700 (compared to conventional sequential processing). In addition, higher yield is obtained because each fabrication defect will only render non-operative the particular semiconductor structure 701 or 702 containing the defect.

Figure 8A:
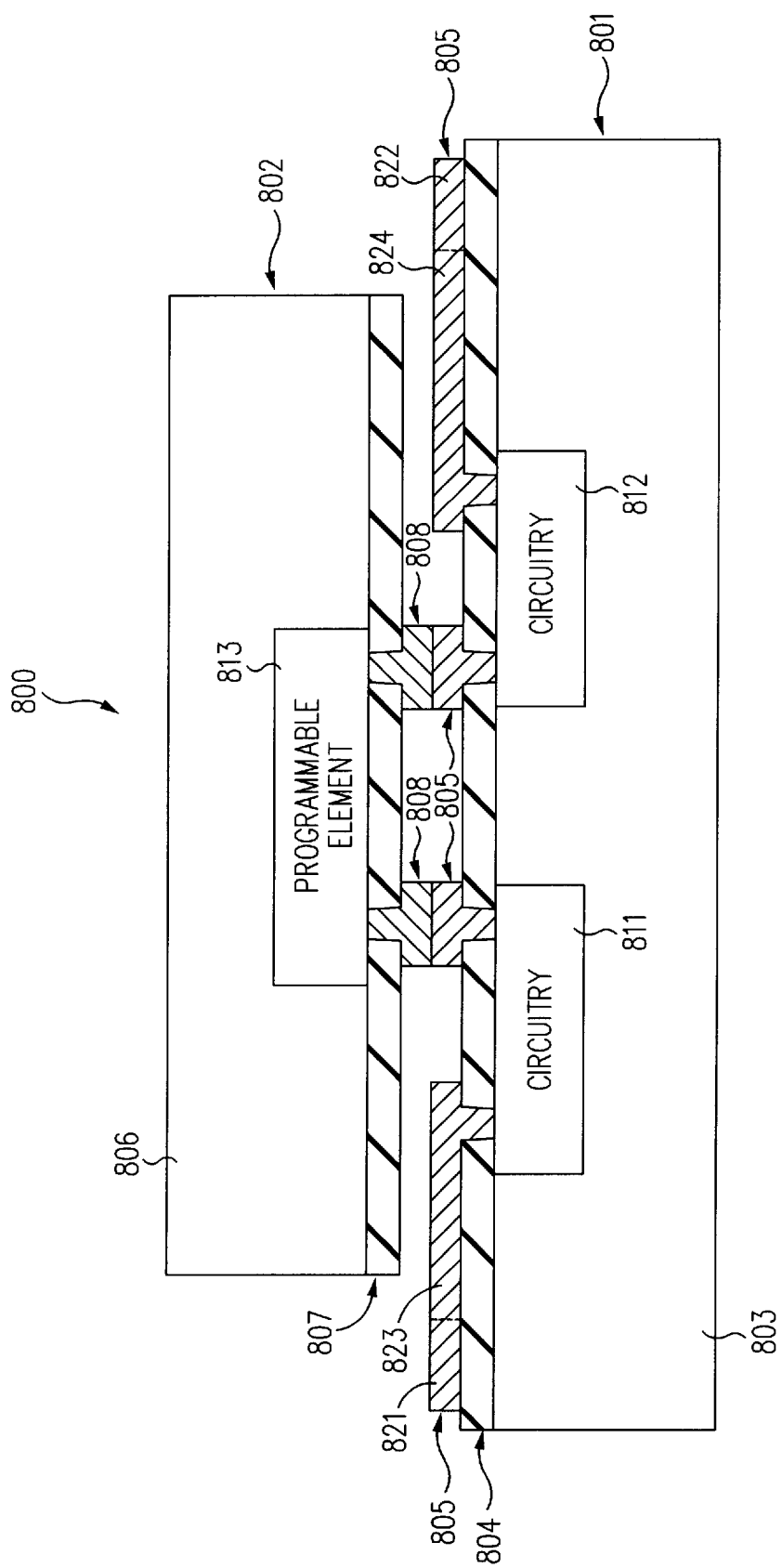
FIGS. 8A, 8B, 9A and 9B are cross sections of bonding pad configurations in accordance with different embodiments of the invention.

FIGS. 8A, 8B, 9A and 9B are cross sectional diagrams illustrating different embodiments for providing bonding pad connections. FIG. 8A illustrates a semiconductor device 800 which includes base semiconductor structure 801 and programmable semiconductor structure 802. Base semiconductor structure 801 includes circuitry 811–812 fabricated in semiconductor substrate 803. Insulating layer 804 and electrically conductive interconnect layer 805 are located over substrate 803. Programmable semiconductor structure 802 includes programmable element 813 fabricated in substrate 806. Programmable element 813 can be any of the programmable elements previously described. In a variation, programmable element 813 is replaced with the non-programmable interconnect structures described in connection with FIGS. 1–3. Insulating layer 807 and electrically conductive interconnect layer 808 are located over substrate 806. In other embodiments, the semiconductor structures 801 and 802 have multiple interconnect layers and insulating layers located over their respective substrates.

Interconnect layer 805 includes bonding pads 821–822 and conductive elements 823–824. Conductive elements 823 and 824 extend from circuitry 811 and 812, respectively, to bonding pads 821 and 822, respectively. The size of programmable semiconductor structure 802 is selected to be smaller than the size of base semiconductor structure 801. As a result, bonding pads 821 and 822 are accessible at the outer edges of base semiconductor structure 801 after semiconductor structures 801 and 802 are connected.

Figure 8B:
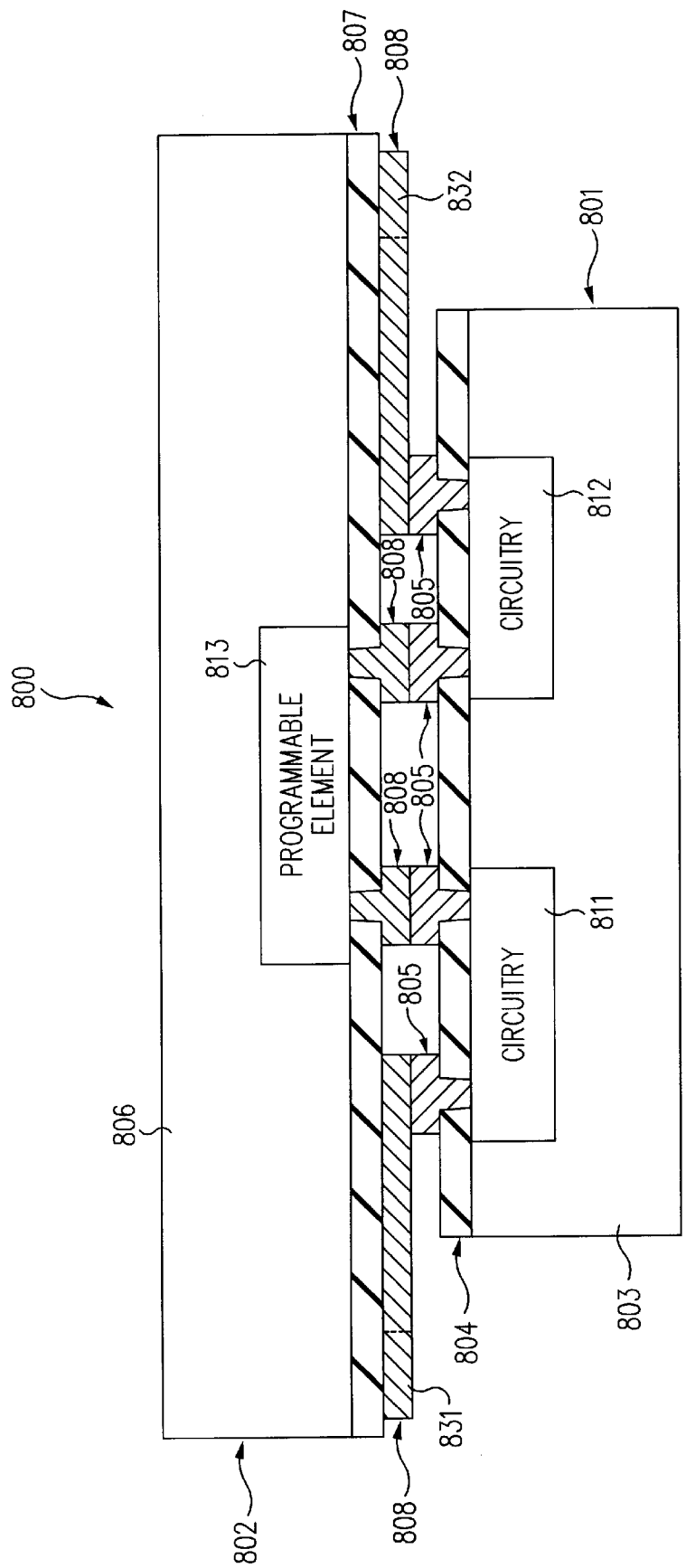

FIG. 8B illustrates a variation of semiconductor device 800 in which base semiconductor structure 801 is made smaller than programmable semiconductor structure 802. In this variation, bonding pads 831 and 832 are fabricated on programmable semiconductor structure 802 as part of electrically conductive layer 808.

Figure 9A:
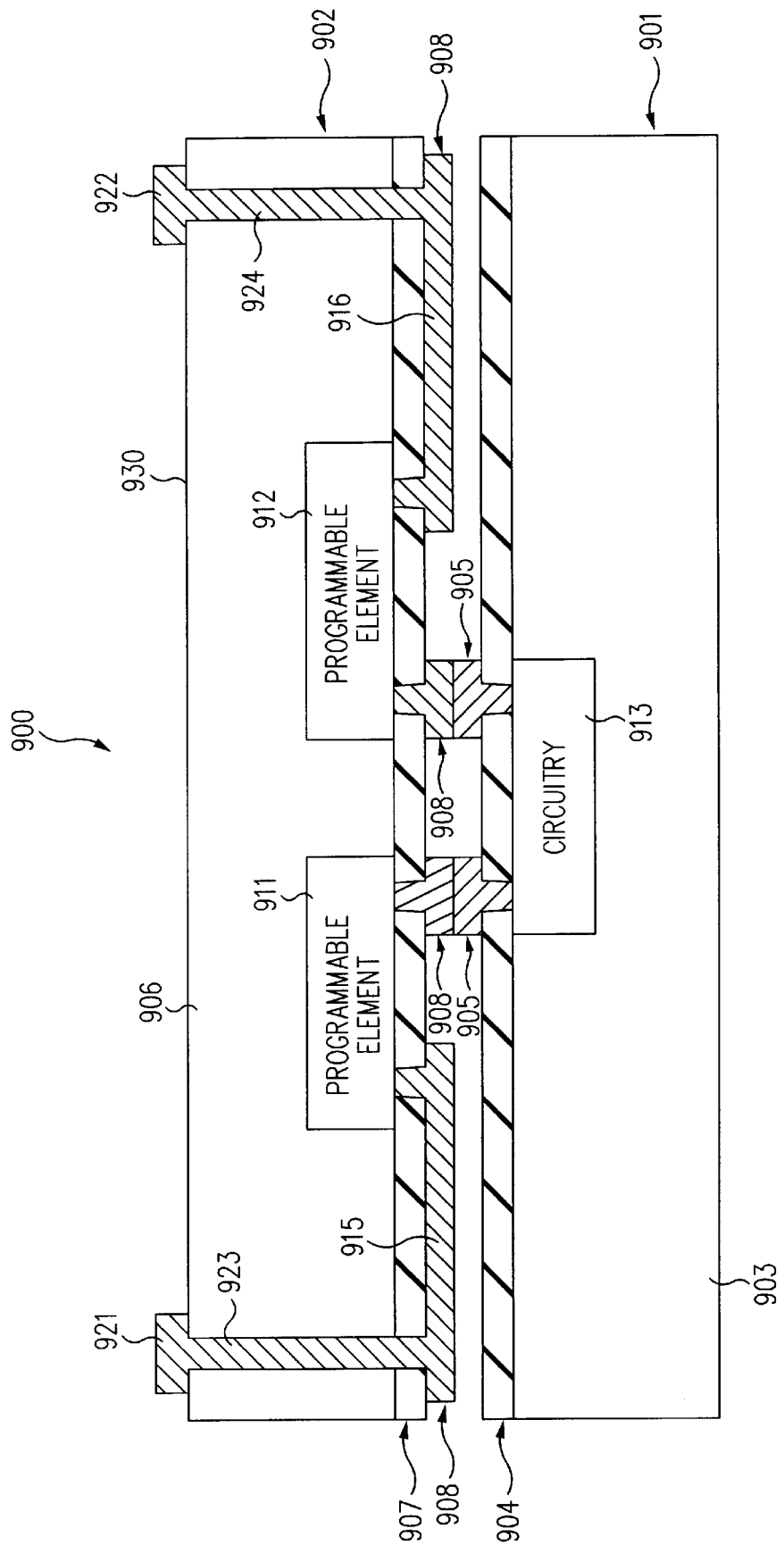

FIG. 9A is a cross sectional diagram of a semiconductor device 900 which includes base semiconductor structure 901 and programmable semiconductor structure 902. Base semiconductor structure 901 includes circuitry 913 fabricated in semiconductor substrate 903. Insulating layer 904 and electrically conductive interconnect layer 905 are located over substrate 903. Programmable semiconductor structure 902 includes programmable elements 911 and 912 fabricated in or on substrate 906. Programmable elements 911–912 can be any of the previously described programmable elements. In a variation, programmable elements 911–912 are replaced with the non-programmable interconnect structures previously described in connection with FIGS. 1–3. Insulating layer 907 and electrically conductive interconnect layer 908 are located over substrate 906. In other embodiments, semiconductor structures 901 and 902 include multiple interconnect layers and insulating layers located over their respective substrates.

Interconnect layer 908 includes electrically conductive elements 915 and 916, which extend toward the outer edges of programmable semiconductor structure 902. Electrically conductive via plugs 923 and 924 are located in vias which extend through programmable semiconductor structure 902. Via plugs 923 and 924 contact conductive elements 915 and 916, respectively, thereby providing electrical connections to interconnect elements 911 and 912, respectively. Bonding pads 921 and 922, which contact via plugs 923 and 924, respectively, are located on upper surface 930 of programmable semiconductor structure 902.

Figure 9B:
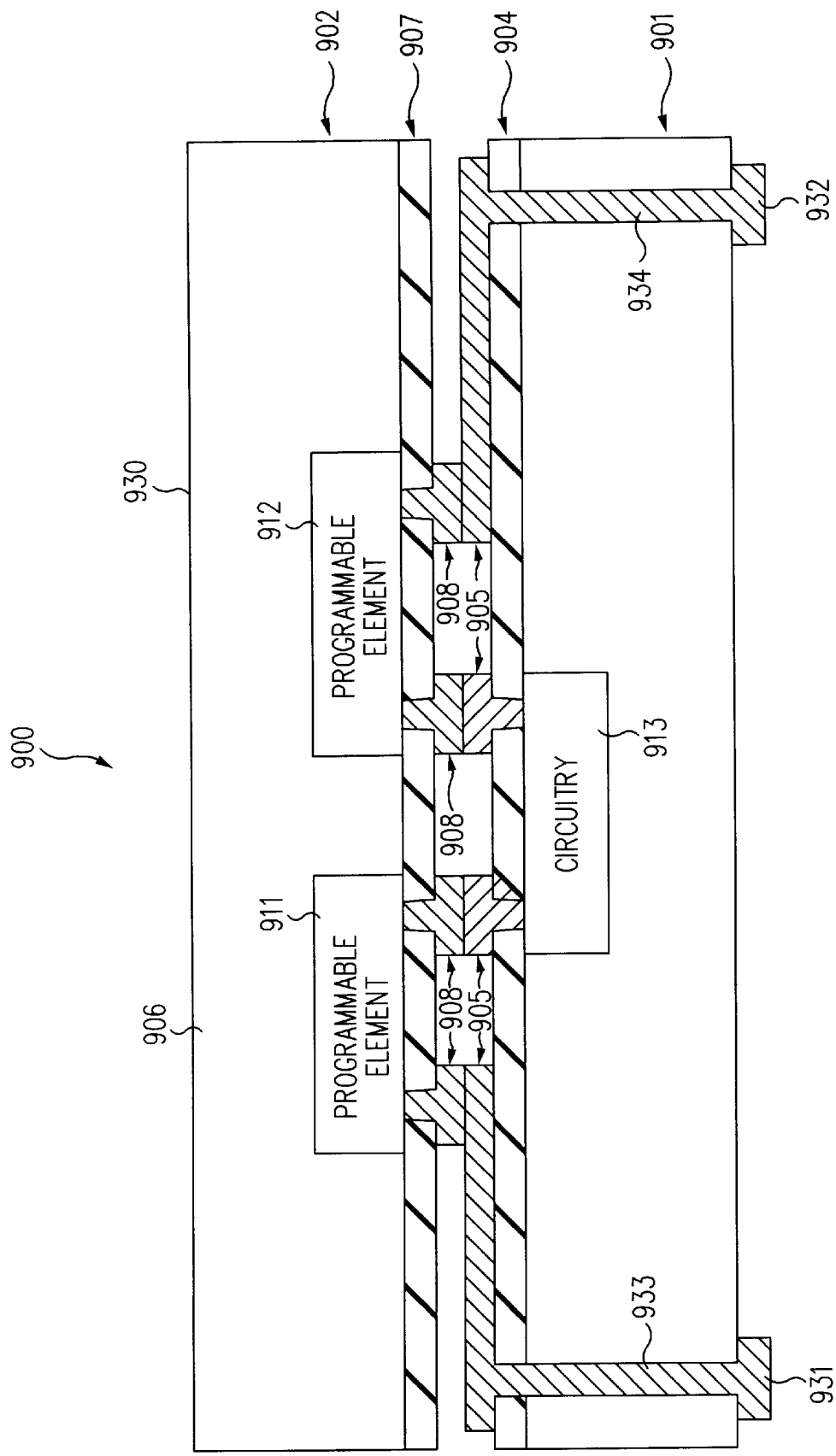

FIG. 9B illustrates a variation of the embodiment of FIG. 9A in which bonding pads 931, 932 and via plugs 933, 934 are formed in base semiconductor structure 901, rather than in programmable semiconductor structure 902.

Although FIGS. 9A and 9B illustrate via plugs 923–924 and 933–934 which are located near the outer edges of semiconductor structures 901 and 902, in other embodiments, such via plugs can be situated at other locations within structures 901–902. That is, via plugs can extend through semiconductor structures 901–902 at a more centrally located position within these structures. In a particular embodiment, via plugs extend through semiconductor structure 902 between programmable elements 911 and 912.

In yet another embodiment, via plugs are fabricated to extend through one of semiconductor structures 901–902 and connect to a conductive contact element formed on the other one of semiconductor structures 901–902.

Although the invention has been described in connection with several embodiments, it is understood that this invention is not limited to the embodiments disclosed, but is capable of various modifications which would be apparent to one of ordinary skill in the art. Thus, the invention is limited only by the following claims.

We claim:

1. An integrated circuit structure comprising:
   a base semiconductor structure, wherein active and passive regions are located in the base semiconductor structure; and
   a programmable semiconductor structure formed separately from the base semiconductor structure and joined to the base semiconductor structure so as to form the integrated circuit structure, wherein the programmable semiconductor structure comprises at least one programmable element.

2. The integrated circuit structure of claim 1, wherein the programmable element is programmable to control the configuration of the integrated circuit structure.

3. The integrated circuit structure of claim 1, wherein the integrated circuit structure is a field programmable logic device and the programmable element is a field programmable element.

4. The integrated circuit structure of claim 1, wherein the programmable element comprises a passive device.

5. The integrated circuit structure of claim 4, wherein the passive device comprises an anti-fuse.

6. The integrated circuit structure of claim 4, wherein the passive device comprises a fuse.

7. The integrated circuit structure of claim 4, wherein the passive device comprises a bipolar junction.

8. The integrated circuit structure of claim 1, wherein the programmable element comprises an active device.

9. The integrated circuit structure of claim 8, wherein the active device comprises an EPROM cell.

10. The integrated circuit structure of claim 8, wherein the active device comprises an EEPROM, a flash memory cell, an EPROM cell or a PROM cell.

11. The integrated circuit structure of claim 1, further comprising:
    a plurality of first contact elements connected to the active and passive regions of the base semiconductor structure, wherein the first contact elements are exposed at a first surface of the base semiconductor structure; and
    a plurality of second contact elements connected to the programmable element, wherein the second contact elements are exposed at a first surface of the programmable semiconductor structure, and wherein the first contact elements are electrically connected to the second contact elements when the base semiconductor structure is joined to the programmable semiconductor structure.

12. The integrated circuit structure of claim 11, wherein the first surface of the base semiconductor structure includes a bonding pad region which extends beyond the first surface of the programmable semiconductor structure when the base semiconductor structure and the programmable semiconductor structure are joined, the integrated circuit structure further comprising:
    an insulating layer located over the first surface of the base semiconductor structure;
    an electrically conductive element located over the insulating layer, wherein the electrically conductive element is connected to at least one of the first contact elements, the electrically conductive element extending to the bonding pad region; and
    a bonding pad located over the insulating layer in the bonding pad region, wherein the bonding pad is connected to the electrically conductive element.

13. The integrated circuit structure of claim 12, wherein the electrically conductive element is connected to at least one of the second contact elements.

14. The integrated circuit structure of claim 11, wherein the first surface of the programmable semiconductor structure includes a bonding pad region which extends beyond the first surface of the base semiconductor structure when the base semiconductor structure and the programmable semiconductor structure are joined, the integrated circuit structure further comprising:
    an insulating layer located over the first surface of the programmable semiconductor structure;
    an electrically conductive element located over the insulating layer, wherein the electrically conductive element is connected to at least one of the second contact elements, the electrically conductive element extending to the bonding pad region; and
    a bonding pad located over the insulating layer in the bonding pad region, wherein the bonding pad is connected to the electrically conductive element.

15. The integrated circuit structure of claim 14, wherein the electrically conductive element is connected to at least one of the first contact elements.

16. The integrated circuit structure of claim 11, wherein the programmable semiconductor structure has a second surface opposite the first surface of the programmable semiconductor structure, the integrated circuit structure further comprising:
    an insulating layer located over the first surface of the programmable semiconductor structure;
    an electrically conductive element located over the insulating layer and connected to at least one of the second contact elements;
    an electrically conductive via plug which extends through the programmable semiconductor structure and is connected to the electrically conductive element; and
    a bonding pad located over the second surface of the programmable semiconductor structure and connected to the via plug.

17. The integrated circuit structure of claim 16, wherein the electrically conductive element is connected to at least one of the first contact elements.

18. The integrated circuit structure of claim 11, wherein the base semiconductor structure has a second surface opposite the first surface of the base semiconductor structure, the integrated circuit structure further comprising:

an insulating layer located over the first surface of the base semiconductor structure;

an electrically conductive element located over the insulating layer and connected to at least one of the first contact elements;

an electrically conductive via plug which extends through the base semiconductor structure and is connected to the electrically conductive element; and a bonding pad located over the second surface of the base semiconductor structure and connected to the via plug.

19. The integrated circuit structure of claim 18, wherein the electrically conductive element is connected to at least one of the second contact elements.

* * * * *